United States Patent
Duggal et al.

(10) Patent No.: US 6,891,330 B2
(45) Date of Patent: May 10, 2005

(54) MECHANICALLY FLEXIBLE ORGANIC ELECTROLUMINESCENT DEVICE WITH DIRECTIONAL LIGHT EMISSION

(75) Inventors: Anil Raj Duggal, Niskayuna, NY (US); Joseph John Shiang, Niskayuna, NY (US); Marc Schaepkens, Ballston Lake, NY (US)

(73) Assignee: General Electric Company, Nishayuna, NY (US)

( * ) Notice: Subject to any disclaimer, the term of this patent is extended or adjusted under 35 U.S.C. 154(b) by 66 days.

(21) Appl. No.: 10/113,137

(22) Filed: Mar. 29, 2002

(65) Prior Publication Data

US 2003/0184219 A1 Oct. 2, 2003

(51) Int. Cl.[7] .................................................. H01J 1/62
(52) U.S. Cl. ....................................... 313/511; 313/512
(58) Field of Search ................................. 313/504, 506, 313/511, 512

(56) References Cited

U.S. PATENT DOCUMENTS

| | | | |
|---|---|---|---|
| 4,540,763 A | 9/1985 | Kirchhoff | |
| 5,185,391 A | 2/1993 | Stokich, Jr. | |
| 5,757,126 A | 5/1998 | Harvey, III et al. | |
| 5,869,930 A * | 2/1999 | Baumberg et al. | 313/506 |
| 5,998,803 A | 12/1999 | Forrest et al. | |
| 6,010,796 A * | 1/2000 | Kijima | 428/690 |
| 6,023,371 A | 2/2000 | Onitsuka et al. | |
| 6,046,543 A | 4/2000 | Bulovic et al. | |
| 6,080,030 A * | 6/2000 | Isaka et al. | 445/24 |
| 6,127,693 A * | 10/2000 | Chen et al. | 257/40 |
| 6,133,589 A * | 10/2000 | Krames et al. | 257/103 |
| 6,573,652 B1 * | 6/2003 | Graff et al. | 313/512 |
| 6,680,570 B2 * | 1/2004 | Roitman et al. | 313/506 |
| 2002/0185965 A1 * | 12/2002 | Collins et al. | 313/501 |
| 2003/0127973 A1 * | 7/2003 | Weaver et al. | 313/504 |

FOREIGN PATENT DOCUMENTS

| | | | |
|---|---|---|---|
| EP | 0847094 | 6/1998 | |
| WO | WO 9748139 | * 12/1997 | H01L/35/24 |

OTHER PUBLICATIONS

"Metal." Encyclopædia Britannica. 2004. Encyclopædia Britannica Online. May 24, 2004 <http://www.search.eb-.com/eb/article?eu=53573>.*

P.E. Burrows et al., "Reliability and Degradation of Organic Light Emitting Devices," Appl Phys. Lett. 65 (23), 2922–2924 Dec. 5 (1994).

H. Suzuki et al., "Near Ultraviolet Electroluminescence from Polysilanes," Thin Solid Films 331, pp. 64–70 (1998).

* cited by examiner

*Primary Examiner*—Joseph Williams
*Assistant Examiner*—Glenn Zimmerman
(74) *Attorney, Agent, or Firm*—Andrew J. Caruso; William E. Powell, III

(57) ABSTRACT

A mechanically flexible and environmentally stable organic electroluminescent ("EL") device with directional light emission comprises an organic EL member disposed on a flexible substrate, a surface of which is coated with a multilayer barrier coating which includes at least one sublayer of a substantially transparent organic polymer and at least one sublayer of a substantially transparent inorganic material. The device includes a reflective metal layer disposed on the organic EL member opposite to the substrate. The reflective metal layer provides an increased external quantum efficiency of the device. The reflective metal layer and the multilayer barrier coating form a seal around the organic EL member to reduce the degradation of the device due to environmental elements.

25 Claims, 5 Drawing Sheets

MECHANICALLY FLEXIBLE ORGANIC ELECTROLUMINESCENT DEVICE WITH DIRECTIONAL LIGHT EMISSION

This invention was first conceived or reduced to practice in the performance of work under contract DE-FC26-00NT40989 awarded by the United States Department of Energy. The United States of America may have certain rights to this invention.

BACKGROUND OF THE INVENTION

The present invention relates generally to light-emitting devices having organic electroluminescent material and, more particularly, to light-emitting devices that are environmentally stable and have improved external quantum efficiency.

Electroluminescent ("EL") devices, which may be classified as either organic or inorganic, are well known in graphic display and imaging art. EL devices have been produced in different shapes for many applications. Inorganic EL devices, however, typically suffer from a required high activation voltage and low brightness. On the other hand, organic EL devices ("OELDs"), which have been developed more recently, offer the benefits of lower activation voltage and higher brightness in addition to simple manufacture, and, thus, the promise of more widespread applications.

An OELD is typically a thin film structure formed on a substrate such as glass or transparent plastic. A light-emitting layer of an organic EL material and optional adjacent semiconductor layers are sandwiched between a cathode and an anode. The semiconductor layers may be either hole (positive charge)-injecting or electron (negative charge)-injecting layers and also comprise organic materials. The material for the light-emitting layer may be selected from many organic EL materials. The light emitting organic layer may itself consist of multiple sublayers, each comprising a different organic EL material. State-of-the-art organic EL materials can emit electromagnetic ("EM") radiation having narrow ranges of wavelengths in the visible spectrum. Unless specifically stated, the terms "EM radiation" and "light" are used interchangeably in this disclosure to mean generally radiation having wavelengths in the range from ultraviolet ("UV") to mid-infrared ("mid-IR") or, in other words, wavelengths in the range from about 300 nm to about 10 micrometer. To achieve white light, prior-art devices incorporate closely arranged OELDs emitting blue, green, and red light. These colors are mixed to produce white light.

Conventional OELDs are built on glass substrates because of low permeability of glass to oxygen and water vapor, which can lead to corrosion or other degradation of the devices. However, glass substrates are not suitable for certain applications in which flexibility is desired. In addition, manufacturing processes involving large glass substrates are inherently slow and, therefore, result in high manufacturing cost. Flexible plastic substrates have been used to build OLEDs. However, these substrates are not impervious to oxygen and water vapor, and, thus, are not suitable per se for the manufacture of long-lasting OELDs.

Moreover, while light is emitted isotropically within the organic EL layer, an observer is located on only one side of the OELD. Therefore, a significant portion of the light emitted through the opposite side is effectively lost, thereby reducing the effective efficiency of the OELD.

Therefore, there is a continued need to have flexible large-area OELDs that are robust against degradation due to environmental elements and have improved light extraction efficiency.

SUMMARY OF THE INVENTION

The present invention provides a flexible light-emitting device that has improved external quantum efficiency by channeling substantially all emitted radiation in the forward half space. The term "forward" means in the direction of an observer. The light-emitting device of the present invention also is less susceptible to degradation due to environmental elements compared to prior art OELDs. A flexible light-emitting device of the present invention comprises: (a) a flexible substantially transparent substrate, at least a surface of which is coated with a multilayer barrier coating which comprises at least a sublayer of an organic material and at least a sublayer of an inorganic material; (b) an organic EL member which comprises an organic EL layer sandwiched between an anode and a cathode, the organic EL member being disposed on the flexible substantially transparent substrate; and (c) a reflective metal layer disposed on the organic EL member opposite to the flexible substantially transparent substrate.

According to one aspect of the present invention, the flexible light-emitting device further comprises a light-scattering layer disposed on a surface of the substantially transparent substrate opposite to the organic EL member.

According to another aspect of the present invention, the light-scattering particles comprise a photoluminescent ("PL") material, which is capable of absorbing a portion of the EM radiation emitted by the organic EL member having a first wavelength range and emitting EM radiation having a second wavelength range.

The present invention also provides a method for making a flexible light-emitting device. The method comprises: (a) providing a flexible substantially transparent substrate, at least a surface of which is coated with a multilayer barrier coating which comprises at least a layer of an organic material and at least a layer of an inorganic material; (b) disposing an organic EL member on the flexible substantially transparent substrate, which organic EL member comprises an organic EL layer disposed between an anode and a cathode; and (c) disposing a reflective metal layer on the organic EL member opposite to the flexible substantially transparent substrate.

According to one aspect of the present invention, the reflective metal layer covers the organic EL member.

According to still another aspect of the present invention, the method for making the flexible light-emitting device further comprises disposing a light-scattering layer on a surface of the substantially transparent substrate opposite to the organic EL member.

According to still another aspect of the present invention, the method further comprises disposing at least a multilayer barrier coating on one or both sides of the organic EL member.

Other aspects, advantages, and salient features of the present invention will become apparent from a perusal of the following detailed description, which, when taken in conjunction with the accompanying figures, discloses embodiments of the present invention.

DETAILED DESCRIPTION OF THE INVENTION

The present invention provides a flexible light-emitting device that has improved external quantum efficiency by channeling a major portion of the radiation emitted by the OELD in the forward half space. In one aspect of the present invention, the flexible light-emitting device has a large area. Such a light-emitting device can comprise one or more OELDs.

As used herein, the term "external quantum efficiency" means the ratio of the radiation energy emitted from the OELD to the electrical energy input into the device. The term "flexible" means being capable of being bent into a shape having a radius of curvature of less than about 100 cm. The term "large-area" means having a dimension of an area greater than or equal to about 10 $cm^2$. The term "substantially transparent" means allowing a total transmission of at least about 50 percent, preferably at least about 80 percent, and more preferably at least 90 percent, of light in the visible range (i.e., having wavelength in the range from about 400 nm to about 700 nm).

Figure 1:
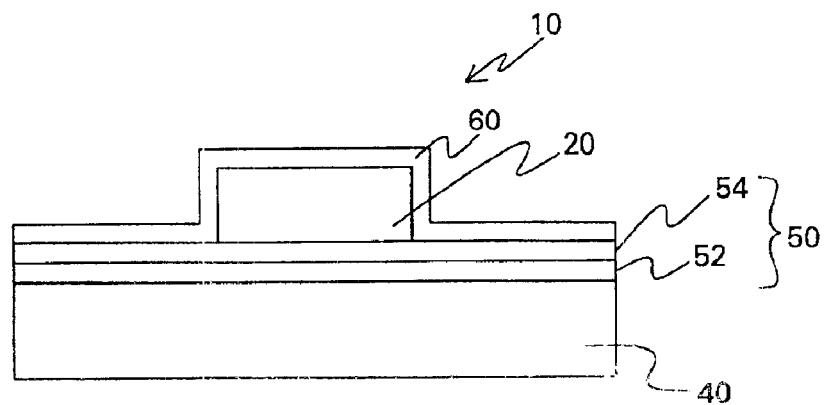
FIG. 1 shows schematically a first embodiment of the present invention.
Figure 2:
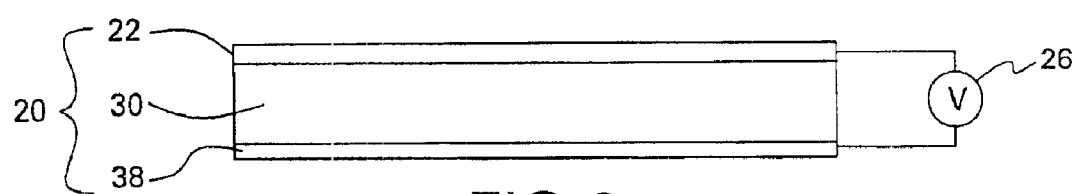
FIG. 2 shows schematically an organic EL member including an organic EL layer and two electrodes.

FIG. 1 is a schematic diagram of an embodiment of the present invention. It should be understood that the figures accompanying this disclosure are not drawn to scale. OELD or a light-emitting device 10 comprises an organic EL member 20 disposed on a substantially transparent substrate 40. A radiation-reflective metal layer 60 is disposed on the organic EL member 20 opposite to the substrate 40. The substrate 40 is coated with a multilayer barrier coating 50 comprising at least one layer of a substantially transparent organic polymeric material 52 and at least one layer of a substantially transparent inorganic material 54. The multilayer barrier coating 50 may be disposed or otherwise formed on either of the two surfaces of the substrate 40 adjacent to the organic EL member 20. Preferably, the multilayer barrier coating 50 is disposed or formed on the surface of the substrate 40 adjacent to the organic EL member 20 or it may completely cover the substrate 40. The multilayer barrier coating 50 will be described in further detail below.

Substrate 40 may be a single piece or a structure comprising a plurality of adjacent pieces of different materials and has an index of refraction (or refractive index) in the range from about 1.05 to about 2.5, preferably from about 1.1 to about 1.6. Preferably, substrate 40 is made of a substantially transparent glass or polymeric material. Examples of suitable polymeric materials are polyethylenterephathalate ("PET"), polyacrylates, polycarbonate, silicone, epoxy resins, and silicone-functionalized epoxy resins.

Light-emitting member 20 comprises at least one layer 30 of at least one organic EL material sandwiched between two electrodes 22 and 38. As will be disclosed below, the light-emitting member may comprise one or more additional layers between an electrode and the layer 30 of organic EL material. When a voltage is supplied by a voltage source 26 and applied across electrodes 22 and 38, light emits from the organic EL material. In a preferred embodiment, electrode 22 is a cathode injecting negative charge carriers (electrons) into organic EL layer 30 and is made of a material having a low work function; e.g., less than about 4 eV. Low-work function materials suitable for use as a cathode are K, Li, Na, Mg, La, Ce, Ca, Sr, Ba, Al, Ag, In, Sn, Zn, Zr, Sm, Eu, alloys thereof, or mixtures thereof. Preferred materials for the manufacture of cathode layer 22 are Ag—Mg, Al—Li, In—Mg, and Al—Ca alloys. Layered non-alloy structures are also possible, such as a thin layer of a metal such as Ca (thickness from about 1 to about 10 nm) or a non-metal such as LiF, covered by a thicker layer of some other metal, such as aluminum or silver. In this embodiment, electrode 38 is an anode injecting positive charge carriers (or holes) into organic layer 30 and is made of a material having a high work function; e.g., greater than about 4.5 eV, preferably from about 5 eV to about 5.5 eV. Indium tin oxide ("ITO") is typically used for this purpose. ITO is substantially transparent to light transmission and allows at least 80% light transmitted therethrough. Therefore, light emitted from organic electroluminescent layer 30 can easily escape through the ITO anode layer without being seriously attenuated. Other materials suitable for use as the anode layer are tin oxide, indium oxide, zinc oxide, indium zinc oxide, cadmium tin oxide, and mixtures thereof. In addition, materials used for the anode may be doped with aluminum or fluorine to improve charge injection property. Electrode layers 22 and 38 may be deposited on the underlying element by physical vapor deposition, chemical vapor deposition, ion beam-assisted deposition, or sputtering. A thin, substantially transparent layer of a metal is also suitable.

Although the preferred order of the cathode and anode layers 22 and 38 is disclosed above, the electrode layers may be reversed. Electrode layers 22 and 38 may serve as the anode and cathode, respectively. Typically, the thickness of the cathode layer in this case is about 200 nm.

Organic EL layer 30 serves as the transport medium for both holes and electrons. In this layer these excited species combine and drop to a lower energy level, concurrently emitting EM radiation in the visible range. Organic EL materials are chosen to electroluminesce in the desired wavelength range. The thickness of the organic EL layer 30 is preferably kept in the range of about 100 to about 300 nm. The organic EL material may be a polymer, a copolymer, a mixture of polymers, or lower molecular-weight organic molecules having unsaturated bonds. Such materials possess a delocalized π-electron system, which gives the polymer chains or organic molecules the ability to support positive and negative charge carriers with high mobility. Suitable EL polymers are poly(n-vinylcarbazole) ("PVK", emitting violetto-blue light in the wavelengths of about 380–500 nm); poly(alkylfluorene) such as poly(9,9-dihexylfluorene) (410–550 nm), poly(dioctylfluorene) (wavelength at peak EL emission of 436 nm), or poly{9,9-bis(3,6-dioxaheptyl)-fluorene-2,7-diyl} (400–500 nm); poly(praraphenylene) derivatives such as poly(2-decyloxy-1,4-phenylene) (400–550 nm). Mixtures of these polymers or copolymers based on one or more of these polymers and others may be used to tune the color of emitted light.

Another class of suitable EL polymers is the polysilanes. Polysilanes are linear silicon-backbone polymers substituted with a variety of alkyl and/or aryl side groups. They are quasi one-dimensional materials with delocalized σ-conjugated electrons along polymer backbone chains. Examples of polysilanes are poly(di-nbutylsilane), poly(di-n-pentylsilane), poly(di-n-hexylsilane), poly(methylphenylsilane), and poly{bis(p-butylphenyl)silane} which are disclosed in H. Suzuki et al., "Near-Ultraviolet Electroluminescence From Polysilanes," 331 Thin Solid Films 64–70 (1998). These polysilanes emit light having wavelengths in the range from about 320 nm to about 420 nm.

Organic materials having molecular weight less than about 5000 that are made of a large number of aromatic units are also applicable. An example of such materials is 1,3,5-tris{n-(4-diphenylaminophenyl) phenylamino}benzene, which emits light in the wavelength range of 380–500 nm. The organic EL layer also may be prepared from lower molecular weight organic molecules, such as phenylanthracene, tetraaryiethene, coumarin, rubrene, tetraphenylbutadiene, anthracene, perylene, coronene, or their derivatives. These materials generally emit light having maximum wavelength of about 520 nm. Still other suitable materials are the low molecular-weight metal organic complexes such as aluminum-, gallium-, and indium-acetylacetonate, which emit light in the wavelength range of 415–457 nm, aluminum-(picolymethylketone)-bis{2,6-di(t-butyl)phenoxide} or scandium-(4-methoxypicolyimethylketone)-bis(acetylacetonate), which emits in the range of 420–433 nm. For white light application, the preferred organic EL materials are those emit light in the blue-green wavelengths.

More than one organic EL layer may be formed successively one on top of another, each layer comprising a different organic EL material that emits in a different wavelength range. Such a construction can facilitate a tuning of the color of the light emitted from the overall light-emitting device 10.

Figure 3:
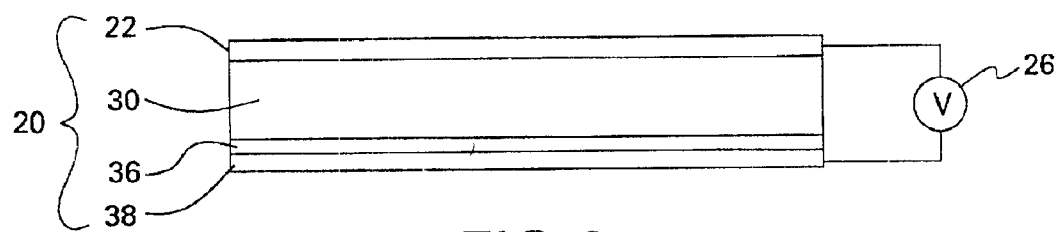
FIG. 3 shows schematically an organic EL member including a hole injection enhancement layer.

Furthermore, one or more additional layers may be included in light-emitting member 20 to increase the efficiency of the overall device 10. For example, these additional layers can serve to improve the injection (electron or hole injection enhancement layers) or transport (electron or hole transport layers) of charges into the organic EL layer. The thickness of each of these layers is kept to below 500 nm, preferably below 100 nm. Materials for these additional layers are typically low-to-intermediate molecular weight (less than about 2000) organic molecules. They may be applied during the manufacture of the device 10 by conventional methods such as spray coating, dip coating, or physical or chemical vapor deposition. In one embodiment of the present invention, as shown in FIG. 3, a hole injection enhancement layer 36 is formed between the anode layer 38 and the organic EL layer 30 to provide a higher injected current at a given forward bias and/or a higher maximum current before the failure of the device. Thus, the hole injection enhancement layer facilitates the injection of holes from the anode. Suitable materials for the hole injection enhancement layer are arylene-based compounds disclosed in U.S. Pat. No. 5,998,803; such as 3,4,9,10-perylenetetracarboxylic dianhydride or bis(1,2,5-thiadiazolo)-p-quinobis (1,3-dithiole).

Figure 4:
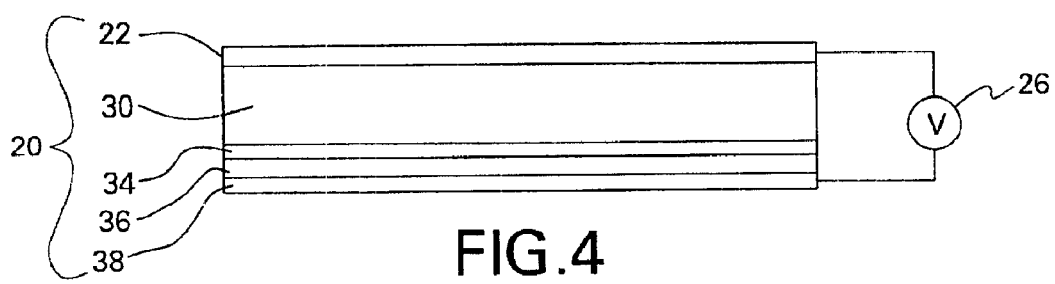
FIG. 4 shows schematically an organic EL member including a hole injection enhancement layer and a hole transport layer.

In another embodiment of the present invention, as shown in FIG. 4, light-emitting member 20 further includes a hole transport layer 34 which is disposed between the hole injection enhancement layer 36 and the organic EL layer 30. The hole transport layer 34 has the functions of transporting holes and blocking the transportation of electrons so that holes and electrons are optimally combined in the organic EL layer 30. Materials suitable for the hole transport layer are triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371, which is incorporated herein by reference.

Figure 5:
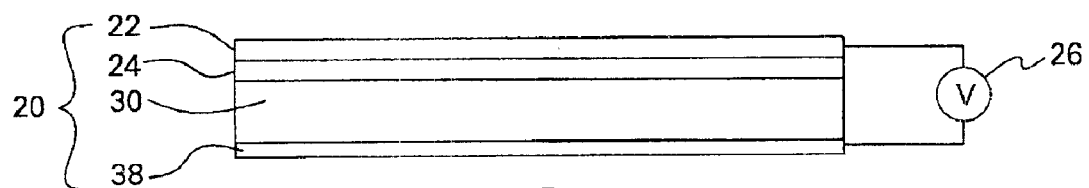
FIG. 5 shows schematically an organic EL member including an electron injecting and transporting layer.

In still another embodiment of the present invention, as shown schematically in FIG. 5, light-emitting member 20 includes an additional layer 24 which is disposed between the cathode layer 22 and the organic EL layer 30. Layer 24 has the combined function of injecting and transporting electrons to the organic EL layer 30. Materials suitable for the electron injecting and transporting layer are metal organic complexes such as tris(8-quinolinolato)aluminum, oxadiazole derivatives, perylene derivatives, pyridine derivatives, pyrimidine derivatives, quinoline derivatives, quinoxaline derivatives, diphenylquinone derivatives, and nitro-substituted fluorene derivatives, as disclosed in U.S. Pat. No. 6,023,371, which is incorporated herein by reference.

Reflective metal layer 60 serves to reflect any radiation emitted away from the substantially transparent substrate 40 and direct such radiation toward the substrate 40 such that the total amount of radiation emitted in this direction is increased. Reflective metal layer 60 also serves an additional function of preventing diffusion of reactive environmental elements, such as oxygen and water vapor, into the organic EL element 20. Such a diffusion otherwise can degrade the long-term performance of the OELD. Suitable metals for the reflective layer 60 are silver, aluminum, and alloys thereof. It may be advantageous to provide a thickness that is sufficient to substantially prevent the diffusion of oxygen and water vapor, as long as the thickness does not substantially reduce the flexibility of the entire device. In one embodiment of the present invention, one or more additional layers of at least a different material, such as a different metal or metal compound, may be formed on the reflective layer to further reduce the rate of diffusion of oxygen and water vapor into the organic EL member. In this case, the material for such additional layer or layers need not be a reflective material. Compounds, such as metal oxides, nitrides, carbides, oxynitrides, or oxycarbides, may be useful for this purpose.

Figure 6:
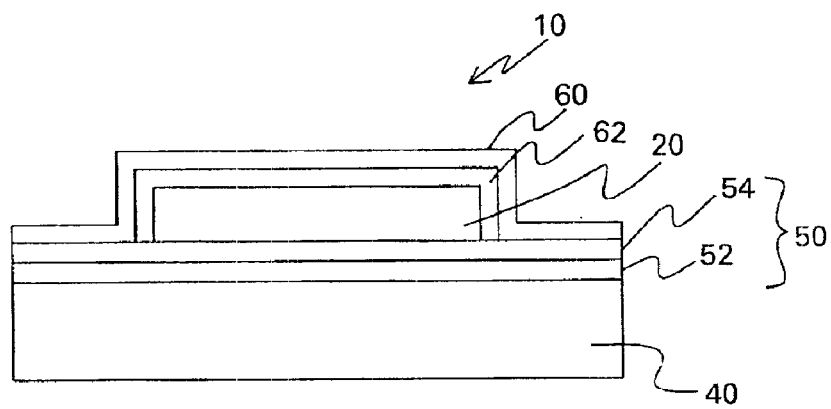
FIG. 6 shows schematically an embodiment of the organic EL device having a bonding layer between the EL member and the reflective layer.

In another embodiment of the present invention, as shown in FIG. 6, a bonding layer 62 of a substantially transparent organic polymeric material may be disposed on the organic EL member 20 before the reflective metal layer 60 is deposited thereon. Examples of materials suitable for forming the organic polymeric layer are polyacrylates such as polymers or copolymers of acrylic acid, methacrylic acid, esters of these acids, or acylonitrile; poly(vinyl fluoride); poly(vinylidene chloride); poly(vinyl alcohol); copolymer of vinyl alcohol and glyoxal (also known as ethanedial or oxaaldehyde); polyethyleneterephthalate ("PET"), parylene (thermoplastic polymer based on p-xylene), and polymers derived from cycloolefins and their derivatives (such as poly(arylcyclobutene) disclosed in U.S. Pat. Nos. 4,540,763 and 5,185,391 which are incorporated herein by reference). Preferably, the bonding layer material is an electrically insulating and substantially transparent polymeric material. A suitable material is polyacrylates.

Figure 7:
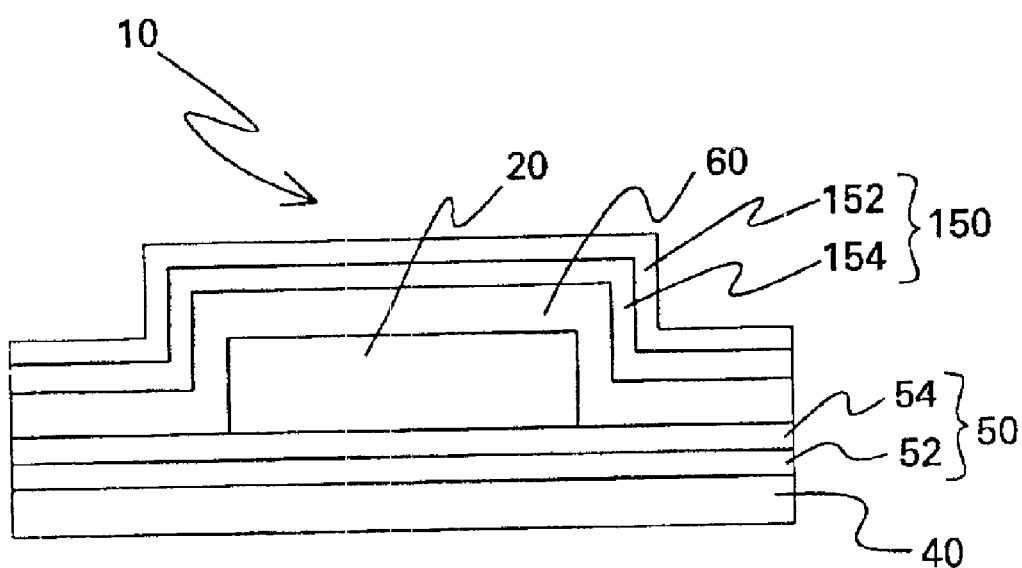
FIG. 7 shows schematically an embodiment of the organic EL device having a second multilayer barrier coating disposed on the reflector layer.

Multilayer barrier coating 50 serves as a protective layer to prevent or substantially reduce the diffusion of oxygen and water vapor through substrate 40. Multilayer barrier coating 50 may be disposed on either surface of the substrate 40 or it may completely surround the substrate 40. Preferably, multilayer barrier coating 50 is disposed on a surface of the substrate 40 adjacent to the organic EL member 20. When multilayer barrier coating 50 is disposed on a surface of the substrate opposite the organic EL member 20, such a barrier coating may be advantageously formed so to cover substantially all edges of the substrate 40 that are not covered by at least a metal or a metal compound of the reflective barrier layer 60. Multilayer barrier coating 50 is constructed of at least one sublayer of a substantially transparent polymer and at least one sublayer of a substantially transparent inorganic material having low permeability of oxygen, water vapor, and other reactive materials present in the environment. By "low permeability," it is meant that the permeability of oxygen or other reactive gases is less than about 1 $cm^3$ (at standard temperature and pressure)/$m^2$/day/atm, and the permeability of water vapor is less than about 1 g/$m^2$/day. The permeation rates of moisture, oxygen, and other reactive materials decrease as the number of alternating sublayers increases. Although FIG. 7 shows four sublayers 52, 54, 56, and 58, any number of sublayers at least two is suitable for the reduction of moisture, oxygen, and other reactive materials. The polymeric sublayers reduce the permeation rates of gases through barrier 50 by reducing the number of straight-through paths resulting from defects in the inorganic sublayers upon which or under which the polymeric sublayer is formed. When the barrier layer includes more than one polymeric sublayer and more than one inorganic sublayer, different polymers and inorganic materials may be advantageously used for the individual sublayers. The thickness of each inorganic sublayer is typically in the range from about 1 to about 500 nm, preferably from about 10 nm to about 100 nm, and that of an organic sublayer typically about 1 to about 10000 nm, preferably from about 10 nm to about 5000 nm. The polymeric sublayer may be formed by physical vapor deposition, chemical vapor deposition, deposition from flash-evaporated materials, dip coating, or spray coating of the monomer, followed by polymerization. Physical or chemical vapor deposition may be desirably conducted under a subatmospheric pressure, for example, to minimize an introduction of unwanted molecules in the growing sublayers. The inorganic sublayer may be formed by physical vapor deposition, chemical vapor deposition, ion beam-assisted deposition, sputtering, or plasma-enhanced chemical vapor deposition ("PECVD"). In addition, metallic layers may be deposited by an electroplating process.

Figure 8:
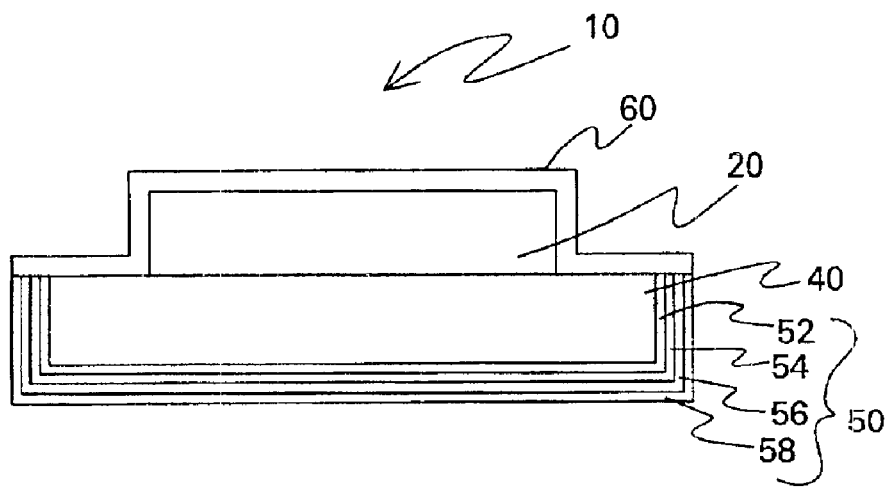
FIG. 8 shows schematically an embodiment of the organic EL device having a multilayer barrier coating disposed opposite to the organic EL member.

In another embodiment of the present invention as shown in FIG. 8, a second multilayer barrier coating 150 comprising sublayers (152, 154) of organic and inorganic materials, which are selected from the materials already disclosed above, is disposed on reflector layer 60. This second multilayer barrier coating serves to seal off any defects that may have been created in reflector layer 60.

Alternatively, multilayer barrier coating 150 can be disposed between organic EL member 20 and reflector layer 60. This configuration may be desirable when it can offer some manufacturing or cost advantage, especially when the transparency of multilayer barrier coating 150 is also substantial.

Examples of materials suitable for forming the polymeric sublayers are polyacrylates such as polymers or copolymers of acrylic acid, methacrylic acid, esters of these acids, or acylonitrile; poly(vinyl fluoride); poly(vinylidene chloride); poly(vinyl alcohol); copolymer of vinyl alcohol and glyoxal; PET, parylene, and polymers derived from cycloolefins and their derivatives such as poly(arylcyclobutene) disclosed in U.S. Pat. Nos. 4,540,763 and 5,185,391. Preferably, the polymeric material is one of polyacrylates.

Examples of materials suitable for forming the inorganic sublayers are metals (the thickness of such metallic films being small enough to render the film substantially transparent), metal carbides, metal oxides, metal nitrides, metal oxycarbides, metal oxynitrides, and carbonitride. Examples of metals are aluminum, silver, copper, gold, platinum, palladium, and alloys thereof. Preferred metals are aluminum and silver. Examples of metal oxides are ITO, tin oxide, silicon oxides, indium oxide, zinc oxide, aluminum oxide, magnesium oxide, composites thereof, and solutions thereof. Preferred metal oxides are ITO, tin oxide, aluminum oxide, and silicon dioxide. Examples of metal nitrides are nitrides of Groups IVA, VA, VIA, IIIB, and IVB of the Periodic Table. Preferred metal compounds are silicon nitride, silicon oxynitride, silicon oxycarbide, aluminum nitride, and aluminum oxynitride.

Figure 9:
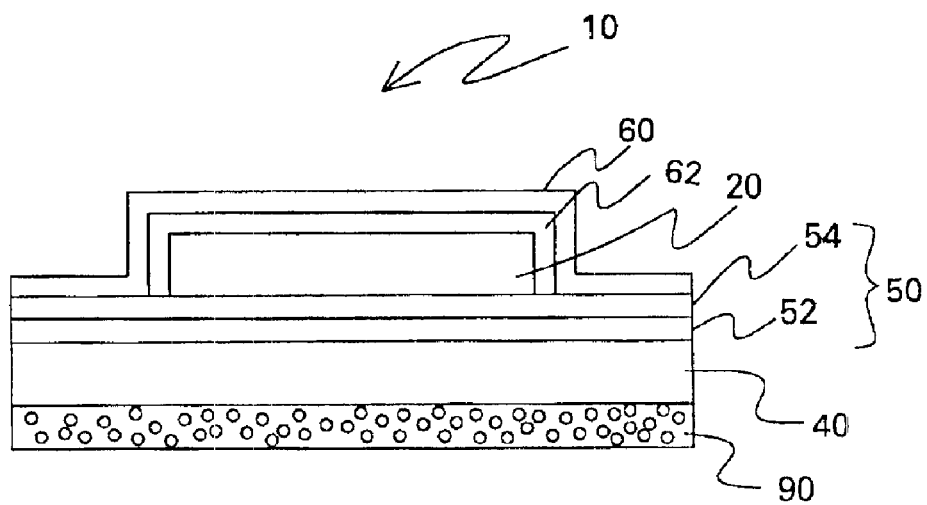
FIG. 9 shows schematically an embodiment of the organic EL device having a scattering or phosphor layer.

In another embodiment of the present invention, the light-emitting device 10 further comprises a light-scattering material disposed in the path of light emitted from the light-emitting device 10 to provide more uniform light therefrom. For example, FIG. 9 illustrates an embodiment comprising a layer 90 of scattering material disposed on the substrate 40. The light-scattering material is provided by choosing particles that range in size from about 10 nm to about 100 micrometers. A preferred embodiment includes particles about 4 micrometers in size. For example, for a device emitting white light, the particle size is preferably on the order of 50–65 nm. Particles of the light-scattering material may be advantageously dispersed in a substantially transparent polymeric film-forming material such as those disclosed above, and the mixture is formed into a film which may be disposed on the substrate 40. Suitable light-scattering materials are solids having refractive index higher than that of the film forming material. Since typical film forming materials have refractive indices between about 1.3 to about 1.6, the particulate scattering material should have a refractive index higher than about 1.6 and should be optically transparent over the target wavelength range. In addition, it is preferable that the light scattering material be non-toxic and substantially resistant to degradation upon exposure to normal ambient environments. For a device designed to provide visible illumination (wavelength in the range of about 400–700 nm), examples of suitable light-scattering materials are rutile ($TiO_2$), hafnia ($HfO_2$), zirconia ($ZrO_2$), zircon ($ZrO_2$ $SiO_2$), gadolinium gallium garnet ($Gd_3Ga_5O_{12}$), barium sulfate, yttria ($Y_2O_3$), yttrium aluminum garnet ("YAG", $Y_3Al_5O_{12}$), calcite ($CaCO_3$), sapphire ($Al_2O_3$), diamond, magnesium oxide, germanium oxide. It is necessary to prepare these compounds with a high degree of optical purity; i.e. impurities that absorb light in the wavelength range of interest must be rigorously minimized. It is not necessary that the compound be stoichiometrically pure, phase pure, and may contain appropriate atomic substitutions; e.g., Gd may be substituted for up to 60% of the yttrium in YAG. Particles composed of high-refractive index glasses, such as may be obtained from Schott Glass Technologies or Corning, Inc. may also be used, provided that they are impervious to darkening from exposure to light emitted by the OELD and its phosphors. Scattering of light may also be achieved with a plastic or glass film having a roughened or textured surface (a "diffuser film"), the roughened features of which are typically on the order of a fraction of the wavelength of the scattered light. In one embodiment of the present invention, one surface of the substrate can be textured or roughened to promote light scattering.

According another aspect of the present invention, the light-scattering particles in layer 90 can comprise a PL material (or also herein called a "phosphor"), which is capable of absorbing a portion of the EM radiation emitted by the organic EL member having a first wavelength range and emitting EM radiation having a second wavelength range. Thus, inclusion of such a PL material can provide a tuning of color flight emitted from the OELD. The particle size and the interaction between the surface of the particle and the polymeric medium determine how well particles are dispersed in polymeric materials to form the film or layer 90. Many micrometer-sized particles of oxide materials, such as zirconia, yttrium and rare-earth garnets, and halophosphates, disperse well in standard silicone polymers, such as poly (dimethylsiloxanes) by simple stirring. If necessary, other dispersant materials (such as a surfactant or a polymeric material like poly(vinyl alcohol)) may be added such as are used to suspend many standard phosphors in solution. The phosphor particles may be prepared from larger pieces of phosphor material by any grinding or pulverization method, such as ball milling using zirconia-toughened balls or jet milling. They also may be prepared by crystal growth from solution, and their size may be controlled by terminating the crystal growth at an appropriate time. The preferred phosphor materials efficiently absorb EM radiation emitted by the organic EL material and re-emit light in another spectral region. Such a combination of the organic EL material and the phosphor allows for a flexibility in tuning the color of light emitted by the light-emitting device 10. A particular phosphor material or a mixture of phosphors may be chosen to emit a desired color or a range of color to complement the color emitted by the organic EL material and that emitted by the organic PL materials. An exemplary phosphor is the cerium-doped yittrium aluminum oxide $Y_3Al_5O_{12}$ garnet ("YAG:Ce"). Other suitable phosphors are based on YAG doped with more than one type of rare earth ions, such as $(Y_{1-x-y}Gd_xCe_y)_3Al_5O_{12}$ ("YAG:Gd,Ce"), $(Y_{1-x}Ce_x)_3(Al_{1-y}Ga_y)O_{12}$ ("YAG:Ga,Ce"), $(Y_{1-x-y}Gd_xCe_y)(Al_{5-z}Ga_z)O_{12}$ ("YAG:Gd,Ga,Ce"), and $(Gd_{1-x}Ce_x)Sc_2Al_3O_{12}$ ("GSAG") where $0 \leq x \leq 1$, $0 \leq y \leq 1$, $0 \leq z \leq 5$ and $x+y \leq 1$. For example, the YAG:Gd,Ce phosphor shows an absorption of light in the wavelength range from about 390 nm to about 530 nm (i.e., the blue-green spectral region) and an emission of light in the wavelength range from about 490 nm to about 700 nm (i.e., the green-to-red spectral region). Related phosphors include $Lu_3Al_5O_{12}$ and $Tb_2Al_5O_{12}$, both doped with cerium. In addition, these cerium-doped garnet phosphors may also be additionally doped with small amounts of Pr (such as about 0.1–2 mole percent) to produce an additional enhancement of red emission. The following are examples of phosphors that are efficiently excited by EM radiation emitted in the wavelength region of 300 nm to about 500 nm by polysilanes and their derivatives.

Green-emitting phosphors: $Ca_8Mg(SiO_4)_4Cl_2:Eu^{2+}$, $Mn^{2+}$; $GdBO_3:Ce^{3+}$, $Tb^{3+}$; $CeMgAl_{11}O_{19}$: $Tb^{3+}$; $Y_2SiO_5:Ce^{3+},Tb^{3+}$; and $BaMg_2Al_{16}O_{27}:Eu^{2+},Mn^{2+}$.

Red-emitting phosphors: $Y_2O_3:Bi^{3+},Eu^{3+}$; $Sr_2P_2O_7:Eu^{2+}$, $Mn^{2+}$; $SrMgP_2O_7:Eu^{2+},Mn^{2+}$; $(Y,Gd)(V,B)O_4:Eu^{3+}$; and $3.5MgO.0.5MgF_2.GeO_2$: $Mn^{4+}$ (magnesium fluorogermanate).

Blue-emitting phosphors: $BaMg_2Al_{16}O_{27}:Eu^{2+}$; $Sr_5(PO_4)_{10}Cl_2:Eu^{2+}$; and $(Ba,Ca,Sr)_5(PO_4)_{10}(Cl,F)_2:Eu^{2+}$, $(Ca,Ba,Sr)(Al,Ga)_2S_4:Eu^{2+}$.

Yellow-emitting phosphors: $(Ba,Ca,Sr)_5(PO_4)_{10}(Cl,F)_2:Eu^{2+},Mn^{2+}$.

Still other ions may be incorporated into the phosphor to transfer energy from the light emitted from the organic material to other activator ions in the phosphor host lattice as a way to increase the energy utilization. For example, when $Sb^{3+}$ and $Mn^{2+}$ ions exist in the same phosphor lattice, $Sb^{3+}$ efficiently absorbs light in the blue region, which is not absorbed very efficiently by $Mn^{2+}$, and transfers the energy to $Mn^{2+}$ ion. Thus, a larger total amount of light emitted by the organic EL material is absorbed by both ions, resulting in higher quantum efficiency of the total device.

The phosphor particles are dispersed in a film-forming polymeric material, such as polyacrylates, substantially transparent silicone or epoxy. A phosphor composition of less than about 30, preferably less than about 10, percent by volume of the mixture of polymeric material and phosphor is used. A solvent may be added into the mixture to adjust the viscosity of the film-forming material to a desired level. The mixture of the film-forming material and phosphor particles is formed into a layer by spray coating, dip coating, printing, or casting on a substrate. Thereafter, the film is removed from the substrate and disposed on the light-emitting member 20. The thickness of film or layer 90 is preferably less than 1 mm, more preferably less than 500 µm. Preferably, the film-forming polymeric materials have refractive indices close to those of the substrate 40 and the organic EL, material; i.e., in the range from about 1.4 to about 1.6.

According to one aspect of the present invention, particles of a scattering material and a phosphor are dispersed in the same film or layer 90. In another embodiment, scattering film 90 may be a diffuser film which is a plastic or glass film having a roughened surface.

A method of making an OELD of the present invention is now described. A cleaned flexible large-area substrate, such as a plastic, is first provided. Then, a multilayer barrier coating is formed on at least a surface of the flexible substrate. The multilayer barrier coating comprises at least one sublayer of a substantially transparent organic polymeric material and at least one sublayer of a substantially transparent inorganic material, such as those material disclosed above. A precursor of a substantially transparent organic polymer is deposited on a surface of the substrate by physical vapor deposition, chemical vapor deposition, evaporation and deposition, dip coating, printing or spraying. The precursor is then polymerized. Physical or chemical vapor deposition may be desirably conducted under a sub-atmospheric pressure, for example, to minimize an introduction of unwanted molecules in the growing sublayer. A substantially transparent inorganic material is deposited on the organic polymer sublayer by physical vapor deposition, chemical vapor deposition, sputtering, or plasma-enhanced chemical vapor deposition ("PECVD"). In addition, if the inorganic material is a metal, such a sublayer may be deposited by an electroplating process. Although the polymer sublayer is formed on the substrate in the foregoing description, the inorganic material may also be formed first on the substrate, and the organic polymer sublayer is deposited thereon. When the inorganic sublayer material is an electrically conducting material, an insulating sublayer may be desirably formed thereon before the organic FL member 20 is disposed on such a coated substrate.

A first electrically conducting material is deposited on the multilayer barrier coating to form a first electrode of the organic EL member 20. The first electrode may be an anode or a cathode, and one or more appropriate materials are chosen among those disclosed earlier for the electrodes. Preferably, the first electrode is an anode comprising a transparent metal oxide, such as ITO. The first electrode material preferably sputter-deposited on the substrate.

Furthermore, the first electrode may be patterned to a desired configuration by, for example, etching. At least one organic EL material is deposited on the first electrode by physical or chemical vapor deposition, spin coating, dip coating, spraying, printing, or casting, followed by polymerization, if necessary, or curing of the material. The organic EL material may be diluted in a solvent to adjust its viscosity or mixed with another polymeric material that serves as a film-forming vehicle. A second electrically conducting material is deposited on the at least one organic EL material to form a second electrode. Preferably, the second electrode is a cathode. The second electrode may be deposited on the entire area of the organic EL material or patterned into a desired shape or configuration. The thickness of the second electrode is kept to a minimum, such as less than or equal to about 200 nm. The electrodes and the organic EL material comprise the organic EL member 20.

A reflective metal is then deposited on the surface of the organic EL member 20 opposite to the substrate. The reflective metal may be deposited by one of the method described above for deposition of an inorganic layer. In one embodiment of the present invention, a bonding layer of a substantially transparent material is deposited on the organic EL member 20 before the layer of reflective metal is deposited thereon. Preferably, the bonding layer comprises an electrically insulating and substantially transparent polymeric material. The bonding layer may be deposited by one of the methods disclosed above for deposition of an organic layer. The reflective metal layer is formed so to completely surround the organic EL member 20. Preferably, the reflective metal layer together with the multilayer barrier coating forms a hermetic seal around the organic EL member 20. Furthermore, one or more additional layers of other inorganic materials may be deposited on the reflective metal layer.

A mixture of particles of a scattering or PL material and a transparent polymeric material is deposited on the surface of the substrate 40 opposite the organic EL member. Alternatively the mixture may be cast into a tape by a tape casting method, such as the doctor blade method. The tape is then cured and attached to the substrate 40.

In another embodiment, subsets of layers necessary or desired for the operation of an OELD of the present invention are formed in separate assemblies, and the assemblies are laminated or attached together to produce a working device.

In still another aspect of the present invention, large-area flexible displays or lighting systems incorporate OELDs of the present invention.

While specific preferred embodiments of the present invention have been disclosed in the foregoing, it will be appreciated by those skilled in the art that many modifications, substitutions, or variations may be made thereto without departing from the spirit and scope of the invention as defined in the appended claims.

What is claimed is:

1. A light-emitting device comprising:
   a flexible substantially transparent substrate having a first surface and a second surface, at least one of said surfaces being coated with a multilayer barrier coating which comprises at least one sublayer of a substantially transparent organic polymer and at least one substantially transparent inorganic material;
   an organic electroluminescent ("EL") member which comprises an organic EL layer disposed between two electrodes and is disposed on said flexible substantially transparant substrate; and
   a reflective metal layer disposed on the organic EL member opposite to said flexible substantially transparent substrate, said reflective metal layer being capable of reflecting radiation toward said substantially transparent substrate.

2. The light-emitting device according to claim 1, wherein said multilayer barrier coating is joined with said reflective metal layer to form a seal around said organic EL member.

3. A light-emitting device comprising:
   a flexible substantially transparent substrate having a first surface and a second surface, at least one of said surfaces being coated with a multilayer barrier coating which comprises at least one sublayer of a substantially transparent organic polymer and at least one substantially transparent inorganic material;
   an organic eletroluminescent ("EL") member which comprises an organic EL layer disposed between two electrodes and is disposed on said flexible substantially transparent substrate; and
   a reflective metal layer disposed on the organic EL member opposite to said flexible substantially transparent substrate, said reflective metal layer being capable of reflecting radiation toward said substantially transparent substrate;
   the light-emetting device further comprising a second multilayer barrier coating that is disposed on said reflective metal layer.

4. The light-emitting device according to claim 1 further comprising a second multilayer barrier coating that is disposed on said organic EL member.

5. The light-emitting device according to claim 1 further comprising a light-scattering layer, said layer being disposed on a surface of said substrate opposite said organic EL member.

6. The light-emitting device according to claim 5, wherein said light-scattering layer comprises light-scattering particles.

7. The light-emitting device according to claim 6, wherein said scattering particles comprise a photoluminescent ("PL") material that absorbs a portion of electromagnetic ("EM") radiation having a first wavelength range emitted by said organic EL member and emits EM radiation having a second wavelength range.

8. The light-emitting device according to claim 6, wherein said scattering particles are dispersed in a substantially transparent polymeric material.

9. The light-emitting device according to claim 5, wherein said light scattering layer has a textured surface.

10. The light-emitting device according to claim 1, wherein said substrate has a textured surface.

11. The light-emitting device according to claim 1, wherein said organic EL member is disposed on said multilayer barrier coating.

12. The light-emitting device according to claim 1, wherein said organic EL member is disposed on a surface of said substrate opposite to said multilayer barrier coating.

13. The light-emitting device according to claim 1 further comprising a bonding layer of a substantially transparent organic polymer disposed on said organic EL member, wherein said reflective metal layer is disposed on said bonding layer.

14. The light-emitting device according to claim 1, wherein said substantially transparent organic polymer of said multilayer barrier coating is selected from the group consisting of polyacrylates, acrylonitrile, poly(vinyl fluoride), poly(vinylidene chloride), copolymer of vinyl alcohol and glyoxal, polyethyleneterephthalate, parylene, polymers derived from cycloolefins and their derivatives, and mixtures thereof.

15. The light-emitting device according to claim 1, wherein said substantially transparent inorganic material of said multilayer barrier coating is selected from the group consisting of metals, metal carbides, metal oxides, metal nitrides, metal oxynitrides, metal oxycarbides, and carbonitride: wherein when said inorganic material is a metal, a thickness of said sublayer of said inorganic material is selected such that said sublayer of said metal is substantially transparent.

16. The light-emitting device according to claim 1, wherein said organic EL layer comprises a material selected from the group consisting of poly(n-vinylcarbazole), poly(alkylfluorene), poly(paraphenylene), polysilanes, derivatives thereof, mixtures thereof, and copolymers thereof.

17. The light-emitting device according to claim 1, wherein said organic EL layer comprises a material selected from the group consisting of 1,2,3-tris{n-(4-diphenylaminophenyl)phenylamino} benzene, phenylanthracene, tetraarylethene, coumarin, rubrene, tetraphenylbutadiene, anthracene, perylene, coronene, aluminum(picolymethylketone)-bis{2,6-di(t-butyl)phenoxide, scandium-(4-methoxy-picolymethylketone)-bis(acetylacetonate), aluminum-acetylacetonate, gallium-acetylacetonate, and indium-acetylacetonate.

18. The light-emitting device according to claim 1, wherein one of said two electrodes is an anode which is disposed on said substrate, and said anode comprises a material selected from the group consisting of indium tin oxide ("ITO"), tin oxide, indium oxide, zinc oxide, indium zinc oxide, cadmium tin oxide, mixtures thereof, and these oxides doped with aluminum or fluorine.

19. The light-emitting device according to claim 1, wherein a second of said two electrodes is a cathode and comprises a material selected from the group consisting of K, Li, Na, Mg, La, Ce, Ca, Sr, Ba, Al, Ag, In, Sn, Zn, Zr, Sm, Eu, alloys thereof, and mixtures thereof.

20. The light-emitting device according to claim 1, wherein said reflective metal layer comprises a metal selected from the group consisting of aluminum, silver, and alloys thereof.

21. The light-emitting device according to claim 6, wherein said scattering particles comprise a material selected from the group consisting of rutile ($TiO_2$), hafnia ($HfO_2$), zirconia($ZrO_2$), zircon ($ZrO_2.SiO_2$), gadolinium gallium garnet ($Gd_3Ga_5O_{12}$), barium sulfate, yttria ($Y_2O_3$), yttrium aluminum garnet ("YAG", $Y_3Al_5O_{12}$), calcite ($CaCO_3$), sapphire ($Al_2O_3$), diamond, magnesium oxide, germanium oxide, and mixtures thereof.

22. The light-emitting device according to claim 7, wherein said PL material is selected from the group consisting of $(Y_{1-x}Ce_x)_3Al_5O_{12}$; $(Y_{1-x-y}Gd_xCe_y)_3Al_5O_{12}$; $(Y_{1-x}Ce_x)_3(Al_{1-y}Ga_y)O_{12}$; $(Y_{1-x-y}Gd_xCe_y)(Al_{5-z}Ga_z)O_{12}$; $(Gd_{1-x}Ce_x)Sc_2Al_3O_{12}$; $Ca_8Mg(SiO_4)_4Cl_2:Eu^{2+}, Mn^{2+}$; $GdBO_3:Ce^{3+}, Tb^{3+}$; $CeMgAl_{11}O_{19}$; $Tb^{3+}$; $Y_2SiO_5:Ce^{3+}, Tb^{3+}$; $BaMg_2Al_{16}O_{27}:Eu^{2+},Mn^{2+}$; $Y_2O_3:Bi^{3+},Eu^{3+}$; $Sr_2P_2O_7:Eu^{2+},Mn^{2+}$; $SrMgP_2O_7:Eu^{2+},Mn^{2+}$; $(Y,Gd)(V,B)O_4:Eu^{3+}$; $3.5MgO.0.5MgF_2.GeO_2:Mn^{4+}$ (magnesium fluorogermanate); $BaMg_2Al_{16}O_{27}:Eu^{2+}$; $Sr_5(PO_4)_{10}Cl_2:Eu^{2+}$; $(Ca,Ba,Sr)(Al,Ga)_2S_4:Eu^{2+}$; $(Ba,Ca,Sr)_5(PO_4)_{10}(Cl,F)_2:Eu^{2+},Mn^{2+}$; $Lu_3Al_5O_{12}:Ce^{3+}$; $Tb_3Al_5O_{12}:Ce^{3+}$; and mixtures thereof; wherein $0 \leq x \leq 1$, $0 \leq y \leq 1$, $0 \leq z \leq 5$ and $x+y \leq 1$.

23. A light-emitting device comprising:
(a) a flexible substantially transparent substrate having a first surface and a second surface, at least one of said surfaces is coated with a multilayer barrier coating which comprises at least one sublayer of a substantially transparent organic polymer and at least one sublayer of a substantially transparent inorganic material;
(b) an organic EL member which comprises an organic EL layer disposed between two electrodes and is disposed on said flexible substantially transparent substrate;
(c) a bonding layer disposed on said organic EL member opposite said substrate;
(d) a reflective metal layer disposed on said bonding layer; and
(e) a light-scattering layer comprising scattering particles;
wherein said substantially transparent organic polymer of said multilayer barrier coating is selected from the group consisting of polyacrylates, acrylonitrile, poly(vinyl fluoride), poly(vinylidene chloride), copolymer of vinyl alcohol and glyoxal, polyethyleneterephthalate, parylene, polymers derived from cycloolefins and their derivatives, and mixtures thereof;
said substantially transparent inorganic material of said multilayer barrier coating is selected from the group consisting of aluminum, silver, copper, gold, platinum, palladium, alloys thereof, metal carbides, metal oxides, metal nitrides, metal oxycarbides, metal oxynitrides, and carbonitride wherein when said inorganic material is a metal, a thickness of said sublayer of said inorganic material is selected such that said sublayer of said inorganic metal is substantially transparent;
said organic EL layer comprises an EL material selected from the group consisting of poly(n-vinylcarbazole), poly(alkylfluorene), poly(paraphenylene), polysilanes, 1,2,3-tris{n-(4-diphenylaminophenyl) phenylamino} benzene, phenylanthracene, tetraarylethene, coumarin, rubrene, tetraphenylbutadiene, anthracene, perylene, coronene, aluminum-(picolymethylketone)-bis{2,6-di(t-butyl)phenoxide, scandium-(4-methoxy-picolymethylketone)-bis(acetylacetonate), aluminum-acetylacetonate, gallium-acetylacetonate, and indium-acetylacetonate;
said bonding material is selected from the group consisting of polyacrylates, acrylonitrile, poly(vinyl fluoride), poly(vinylidene chloride), copolymer of vinyl alcohol and glyoxal, polyethyleneterephthalate, parylene, polymers derived from cycloclefins and their derivatives, and mixtures thereof;
said reflective metal layer comprises a metal selected from the group consisting of aluminum, silver, and alloys thereof; and
said scattering particles comprises a material selected from the group consisting of rutile ($TiO_2$), hafnia ($HfO_2$), zirconia ($ZrO_2$), zircon ($ZrO_2.SiO_2$), gadolinium gallium garnet ($Gd_3Ga_5O_{12}$), barium sulfate, yttria ($Y_2O_3$), yttrium aluminum garnet ("YAG", $Y_3Al_5O_{12}$), calcite ($CaCO_3$), sapphire ($Al_2O_3$), diamond, magnesium oxide, germanium oxide, and mixtures thereof.

24. A light-emitting device comprising:
(a) a flexible substantially transparent substrate having a first surface and a second surface, at least one of said surfaces is coated with a multilayer barrier coating which comprises at least one sublayer of a substantially transparent organic polymer and at least one sublayer of a substantially transparent inorganic material;
(b) an organic EL member which comprises an organic EL layer disposed between two electrodes and is disposed on said flexible substantially transparent substrate;

(c) a bonding layer disposed on said organic EL member opposite said substrate;

(d) a reflective metal layer disposed on said bonding layer; and (e) a light-scattering layer comprising scattering particles;

wherein said substantially transparent organic polymer of said multilayer barrier coating is selected from the group consisting of polyacrylates, acrylonitrile, poly(vinyl fluoride), poly(vinylidene chloride), copolymer of vinyl alcohol and glyoxal, polyethyleneterephthalate, parylene, polymers derived from cycloolefins and their derivatives, and mixtures thereof;

said substantially transparent inorganic material of said multilayer barrier coating is selected from the group consisting of aluminum, silver, copper, gold, platinum, palladium, alloys thereof, metal carbides, metal oxides, metal nitrides, metal oxycarbides, metal oxynitrides, and carbonitride, wherein when said inorganic material is a metal, a thickness of said sublayer of said inorganic material is selected such that said sublayer of said inorganic metal is substantially transparent;

said organic EL layer comprises an EL material selected from the group consisting of poly(n-vinylcarbazole), poly(alkylfluorene), poly(paraphenylene), polysilanes, 1,2,3-tris{n-(4-diphenylaminophenyl) phenylamino} benzene, phenylanthracene, tetraarylethene, coumarin, rubrene, tetraphenylbutadiene, anthracene, perylene, coronene, aluminum-(picolymethylketone)-bis{2,6-di(t-butyl)phenoxide, scandium-(4-methoxy-picolymethylketone)-bis(acetylacetonate), aluminum-acetylacetonate, gallium-acetylacetonate, and indium-acetylacetonate;

said bonding material is selected from the group consisting of polyacrylates, acrylonitrile, poly(vinyl fluoride), poly(vinylidene chloride), copolymer of vinyl alcohol and glyoxal, polyethyleneterephthalate, parylene, polymers derived from cycloolefins and their derivatives, and mixtures thereof;

said reflective metal layer comprises a metal selected from the group consisting of aluminum, silver, and alloys thereof; and said scattering particles comprises a material selected from the group consisting of rutile ($TiO_2$), hafnia ($HfO_2$), zirconia ($ZrO_2$), zircon ($ZrO_2.SiO_2$), gadolinium gallium garnet ($Gd_3Ga_5O_{12}$), barium sulfate, yttria ($Y_2O_3$), yttrium aluminum garnet ("YAG", $Y_3Al_5O_{12}$), calcite ($CaCO_3$), sapphire ($Al_2O_3$), diamond, magnesium oxide, germanium oxide, and mixtures thereof; and the light-emitting device further comprising a second multilayer barrier coating disposed on said reflective metal layer, said second barrier coating comprising at least a sublayer of an organic material and at least a sublayer of an inorganic material.

25. The light-emitting device according to claim 23 further comprising particles of a PL material mixed with scattering particles in said light-scattering layer, wherein said PL material is selected from the group consisting of $(Y_{1-x}Ce_x)_3Al_5O_{12}$; $(Y_{1-x-y}Gd_xCe_y)_3Al_5O_{12}$; $(Y_{1-x}Ce_x)_3(Al_{1-x-y}Ga_y)O_{12}$, $(Y_{1-x-y}Gd_xCe_y)(Al_xCe_x)Sc_2Al_3O_{12}$; $Ca_8Mg(SiO_4)_4Cl_2:Eu^{2+},Mn^{2+}$;$GdBO_3:Ce^{3+}$, $Tb^{3+}$; $CeMgAl_{11}O_{19}$: $Tb^{3+}$; $Y_2SiO_5:Ce^{3+},Tb^{3+}$; $BaMg_2Al_6O_{27}:Eu^{2+},Mn^{2+}$; $Y_2O_3:Bi^{3+},Eu^{3+}$; $Sr_2P_2O_7:Eu^{2+},Mn^{2+}$; $SrMgP_2O_7:Eu^{2+},Mn^{2+}$; $(Y,Gd)(V,B)O_4:Eu^{3+}$; $3.5MgO.0.5MgF_2.GeO_2:Mn^{4+}$ (magnesium fluorogermanate); $BaMg_2Al_{16}O_{27}:Eu^{2+}$; $Sr_5(PO_4)_{10}Cl_2:Eu^{2+}$; $(Ca,Ba,Sr)(Al,Ga)_2S_4:Eu^{2+}$; $(Ba,Ca,Sr)_5(PO_4)_{10}(Cl,F)_2:Eu^{2+},Mn^{2+}$; $Lu_3Al_5O_{12}:Ce^{3+}$; $Tb_3Al_5O_{12}:Ce^{3+}$; and mixtures thereof; wherein $0 \leq x \leq 1$, $0 \leq y \leq 1$, $0 \leq z \leq 5$ and $x+y \leq 1$.

* * * * *